(12) United States Patent
Doak et al.

(10) Patent No.: US 6,745,717 B2
(45) Date of Patent: Jun. 8, 2004

(54) METHOD AND APPARATUS FOR PREPARING NITRIDE SEMICONDUCTOR SURFACES

(75) Inventors: R. Bruce Doak, Tempe, AZ (US); Christopher T. Burns, Tempe, AZ (US); Dirk C. Jordan, Tempe, AZ (US)

(73) Assignee: Arizona Board of Regents, Tempe, AZ (US)

( * ) Notice: Subject to any disclaimer, the term of this patent is extended or adjusted under 35 U.S.C. 154(b) by 0 days.

(21) Appl. No.: 09/887,777

(22) Filed: Jun. 22, 2001

(65) Prior Publication Data

US 2002/0123239 A1 Sep. 5, 2002

Related U.S. Application Data

(60) Provisional application No. 60/213,149, filed on Jun. 22, 2000.

(51) Int. Cl.[7] .................. C23C 16/00; H01G 37/317
(52) U.S. Cl. .................. 118/723 DC; 118/723 R; 250/492.21; 250/492.23
(58) Field of Search .................. 118/723 DC, 723 R, 118/723 E, 723 ME, 723 FI, 723 FE; 250/492.21, 492.23, 492.3

(56) References Cited

U.S. PATENT DOCUMENTS

| | | | | |
|---|---|---|---|---|
| 3,283,120 | A | * 11/1966 | Spruck | 219/121.26 |
| 5,165,954 | A | * 11/1992 | Parker et al. | 427/526 |
| 5,403,399 | A | * 4/1995 | Kurihara et al. | 118/723 DC |
| 5,821,548 | A | * 10/1998 | Hinchliffe | 250/492.21 |
| 6,207,951 | B1 | * 3/2001 | Yamauchi et al. | 250/251 |

OTHER PUBLICATIONS

J. W. Orton, C. T. Foxton, "Group III nitride semiconductors for short wavelength light–emitting devices" *Reports on Progress in Physics* 61, 1 1–75 (1998).

A. Sellidj, B. A. Ferguson, T. J. Mattord, B. G. Streetman, C. B. Mullins, "Growth of GaN on sapphire (0001) using a supersonic yet of plasma–generated atomic nitrogen" *Applied Physics Letters* 68, 23 3314–3316 (1996).

S. E. Hooper, C. T. Foxton, T. S. Cheng, L. C. Jenkins, D. E. Lacklison, J. W. Orton, T. Bestwock, A. Kean, M. Dawson, G. Duggan, "Some aspects of GaN growth on GaAs (100) substrates using molecular beam epitaxy with an RF activated nitrogen–plasma source" *Journal of Crystal Growth* 155, 157–163 (1995(.

W. C. Hughes, W. H. Rowland Jr., M. A. L. Johnson, S. Fujita, J. W. Cook Jr., J. F. Schetzina, "Molecular beam epitaxy growth and properties of GaN films on GaN/SiC substrates" *Journal of Vacuum Science & Technology B* 13, 4 1571–1577 (1995).

(List continued on next page.)

*Primary Examiner*—Parviz Hassanzadeh
(74) *Attorney, Agent, or Firm*—Gallagher & Kennedy, P.A.; Thomas D. MacBlain

(57) ABSTRACT

Semiconductor nitride layers are produced using a corona discharge supersonic free-jet source producing an activated nitrogen molecule beam impacting a semiconductor substrate in the presence of a group III metal or impacting an oxide layer on a semiconductor substrate. The activated nitrogen molecules are of the form $N_2 A^3\Sigma_u^+$. Apparatus for producing the nitride layer on the substrate includes the corona discharge free-jet source, a skimmer to collimate the $N_2$ beam and succeeding stages interconnected by collimators and evacuated to draw off background gases.

24 Claims, 2 Drawing Sheets

OTHER PUBLICATIONS

T. D. Moustakas, "Epitaxial growth of GaN films produced by ECR–assisted MBE" *Materials Research Society Symposium Proceedings* 395 111–122 (1995).

A. Anders, N. Newman, M. Rubin, M. Dickinson, E. Jones, P. Phatak, A. Gassmann "Hollow–anode plasma source for molecular beam epitaxy of gallium nitride" *Review of Scientific Instruments* 67, 3 905–907 (1996).

M. A. Gappoli, A. E. Kull, K. Schwender, H. Lee, S. J. Harris Jr., and J. Mroczkowski "Arcjet plasma enhanced vapor phase epitaxy of GaN" *Materials Letters* 31 161–164 (1997).

F. J. Grunthaner, T. Bicknell–Tassius, P. Deelman, P. J. Grunthaner, C. Bryson, E. Snyder, J. L. Guiliani, J. P. Apruzese, P. Keeple "Ultrahigh vacuum arcjet nitrogen source for selected energy epitaxy of group III nitrides by molecular beam epitaxy" *Journal of Vacuum Science & Technology A* 16, 3 1615–1620 (1998).

P.C. Engelking, "Corona excited supersonic expansion" *Review of Scientific Instruments* 57, 9 3375–2277 (1986).

D. Neuerschafer, Ch. Ottinger, A. Sharma "Observation of a long–lived nitrogen beam afterglow and lifetime measurements on the $N_2$ ($w^3\Delta_u$) state" *Chemical Physics* 117 133–148 (1987).

J. Q. Searcy, "A supersonic molecular beam metastable atom source initiated by direct discharge" *Review of Scientific Instruments* 45, 4 589–590 (1974).

E. L. Leasure, G. R. Mueller, T. Y. Ridley, "'Hot,' metastable atom, molecular bean source" *Review of Scientific Instruments* 46, 5 635–637 (1975).

D. W. Fahey, L. D. Schearer, W. F. Parks, "igh–flux beam source of fast neutral helium" *Review of Scientific Instruments* 49, 4 503–506 (1978).

D. W. Fahey, W. F. Parks, L. D. Schearer, "High flux beam source of thermal rare–gas metastable atoms" *Journal of Physics E Scientific Instruments* 13, 381–383 (1980).

P. C. Engelking "Spectroscopy of jet–cooled ions and radicals" *Chemical Reviews* 91, 3 399–414 (1991).

K. R. Comer, S. C. Foster, "Infrared spectroscopy of the products of a corona–excited supersonic expansion" *Chemical Physics Letters* 202, 3,4, 216–220 (1993).

K. P. Huger, M. Vervloet, "High resolution fourier transform spectroscopy of supersonic jets" *Journal of Molucular Spectroscopy* 153, 1,2, 17–25 (1992).

I. Hadj Bachir, T. R. Huet, J. L. Destombes, M. Vervloet, "Laser optogalvanic spectroscopy of $N_2$ from the $A^3\Sigma_u^+$ metastable state in a corona excited supersonic expansion" *Chemical Physics Letters* 270, 5,6 533–537 (1997).

D. C. Jordan, R. Barling, R. B. Doak "Refractory graphite skimmers for supersonic free–jet, supersonic arc–jet, and plasma discharge applications" *Review of Scientific Instruments* 70, 3 1640–1648 (1999).

A. Lofthus, P. H. Krupenie "The spectrum of molecular nitrogen" *Journal of Physics Chem. Ref. Data* 6, 1 113–139 (1977).

P. B. Armentrout, S. M. Tarr, A. Dori, R. S. Freund, "Electron impact ionization cross section of metastable $N_2$ ($A\Sigma_u^+$)" *Journal of Chemical Physics* 75, 6 2786–2794 (1981).

P. C. Cosby "Electron–impact dissociation of nitrogen" *Journal of Chemical Physics* 98, 12 9544–9553 (1993).

G. Cernogora, L. Hochard, M. Touzeau, C. Matos Ferreira "Population of $N_2$ ($A^3\Sigma_u^+$) metastable states in a pure nitrogen glow discharge" *Journal of Physics B: Atopmic and Molecular Physics* 14, 16 2977–2987 (1981).

J. A. Meyer, D. W. Setser, D. H. Stedman "Energy transfer reactions of $N_2(A^3\Sigma_u^+)$. II. Quenching and emission by oxygen and nitrogen atoms" *Journal of Physical Chemistry* 74, 10 2238–2240 (1970).

D. C. Cartwright "Electron impact excitation of the electronic states of $N_2$. II. Integral cross sections at incident energies from 10 to 50 $eV^+$" *Physical Review A General Physics* 16, 3 1041–1051 (1977).

H.–Joachim Werner, J. Kalcher, E.–Albrecht Reinsch "Accurate ab initio Calculations of radiative transition probabilities between the $A^3\Sigma_u^+$, $B^3\Pi_g$, $W^3\Delta_u$, $B'^3_u$-, and $C^3\Pi_u$ states of $N_2$" *Journal of Chemical Physics* 81, 5 2420–2431 (1984).

W. Benesch "Oscillator strengths for the $W^3\Delta_u$–$X^1\Sigma_g^{30}$ band system of molecular nitrogen" *Physical Review A General Physics* 19, 2 445–451 (1979).

D. C. Jordan, I. S. T. Tsong, D. J. Smith, B. J. Wilkens, R. B. Doak, "III–N semiconductor growth with activates nitrogen: State–specific study of $A^3\Sigma_u^+$ metastable $N_2$ molecules" *Applied Physics Letters* 77, 19 3030–3032 (2000).

D. C. Jordan, C. T. Burns, R. B. Doak "Corona discharge supersonic free–jet for III–V nitride growth via $A^3\Sigma_u^+$ metastable nitrogen molecules" *Journal of Applied Physics* 89, 2 883–892 (2001).

V. M. Torres, D. C. Jordan, I. S. T. Tsong, R. B. Doak, "Supersonic Bean Epitaxy of Wide Bandgap Semiconductors" *Atomic and Molecular Beams: The state of the art 2000/* Roger Compargue (ed.) Springer–Verlag Berlin Heidelberg New York 945–958.

D. C. Jordan, "A Corona Discharge Source for the Growth of III–V Nitrides" PRD, Dess. 12/99.

\* cited by examiner

METHOD AND APPARATUS FOR PREPARING NITRIDE SEMICONDUCTOR SURFACES

CROSS-REFERENCE TO RELATED APPLICATIONS

Priority is claimed from U.S. provisional patent application Serial No. 60/213,149 filed Jun. 22, 2000 of R. Bruce Doak, Dirk C. Jordan and Christopher T. Burns. That application is incorporated herein by reference.

STATEMENT OF GOVERNMENT SUPPORT

Financial assistance was provided by the U.S. Government under Grant Number N00014-96-1-0962 of the U.S. Office of Naval Research, and the United States Government may own certain rights to this invention.

FIELD OF THE INVENTION

This invention relates to the preparation of nitrogen containing films on substrates and more particularly to preparation of nitride films on semiconductors by introducing nitrogen into a corona discharge, thereby to produce activated nitrogen molecules for application to the substrate.

BACKGROUND OF THE INVENTION

Rapid progress has been realized in semiconductor technology related to the growth of group III metal-nitride films (III-N). Metal-organic vapor-phase epitaxy (MOVPE) has emerged as the leading "III-N" growth process, generally utilizing ammonia and trimethylmetallics as the precursors for nitrogen and group III metals, respectively. In contrast, and despite potential advantages over MOVPE, progress in molecular beam epitaxy (MBE) of III-N semiconductors has been slow. MBE offers a pristine UHV growth environment, a precise control over layer-by-layer composition, the ability to monitor growth in situ via standard surface science tools, and a wide choice of sources. For III-N growth, the latter include effusive or supersonic jets of MOVPE species, discharge sources of activated nitrogen gas, and evaporation sources of high purity metals.

AlN, GaN, and InN are emerging as materials of choice for wide band gap semiconductor devices. Despite the remarkable advances in III-N fabrication, further improvements of growth processes are needed.

BRIEF SUMMARY

In accordance with this invention, certain electronically-excited (or "activated") nitrogen molecules are used as an ideal nitride precursor. This invention provides a method of producing $N_2 A^3\Sigma_u^+$ in essentially a pure state as the sole excited species in a molecular beam whose only other component is ground state nitrogen. Through the use of this method, a high purity, high energy form of nitrogen is produced that when used in III-N fabrication, greatly improves upon both the quality and consistency of metal-III nitride and its production control. This method enables metal-III nitride film production to take advantage of the above discussed benefits of MBE. (The terms "film" and "layer" are used interchangeably herein with no distinction intended.)

A corona discharge supersonic free-jet (CD-SFJ) source has been constructed, characterized, and operated to grow III-N nitride semiconductor films via molecular beam epitaxy (MBE) using $A^3\Sigma_u^+ N_2$, an electronically-excited metastable molecule. By "metastable" is meant molecules having a lifetime in their activated state sufficient to bring them to a location where nitride film growth occurs. The CD-SFJ yields $A^3\Sigma_u^+$ molecules as the sole activated species in a molecular beam otherwise containing only $X^1\Sigma_g^+$ ground state nitrogen molecules plus a negligible quantity of $^4S^0$ ground state nitrogen atoms. The generated beam has been used as a nitrogen source to epitaxially grow metal-nitride (III-N) films via this rich content of excited metastable nitrogen molecules. Optical emission spectroscopy of the free-jet expansion reveals the expected cascade through the excited state manifold of $N_2$ triplet states to populate the $A^3\Sigma_u^+$ metastable state. Appearance potential spectroscopy (mass spectrometer detector ionization yield, measured as a function of electron impact energy) explicitly establishes the fraction of all activated nitrogen species in the terminal beam, including non-emitting metastable species such as the $A^3\Sigma_u^+$ state. Metastable $A^3\Sigma_u^+$ molecules are present at up to 1.6% number fraction even several meters from the source, providing a beam intensity of $8.5 \times 10^{16}$ metastables $sr^{-1}s^{-1}$. Growth studies confirm that $A^3\Sigma_u^+$ does incorporate very efficiently into a growing GaN thin film.

The electronically excited $A^3\Sigma_u^+$ nitrogen molecules couple to the ground state solely via the forbidden Vegard-Kaplan bands. The $A^3\Sigma_u^+$ lifetime is therefore very long, circa one second, and far greater than beam transit times through a molecular beam apparatus. Consequently, $A^3\Sigma_u^+$ molecules are metastable insofar as molecular beam chemistry is concerned, and can be employed in molecular beam epitaxy (MBE) in the fashion of any stable beam species. The suggested use of $N_2 A^3\Sigma_u^+$ to grow GaN is based on two facts: (1) being an electronically excited state, $A^3\Sigma_u^+$ is reactive ("activated"), and (2) being molecular rather than atomic, $A^3\Sigma_u^+$ delivers two atoms simultaneously to the surface. Thereby, in a dissociative chemisorption reaction, one of these two atoms can bind to the surface while the second carries away the heat of reaction as kinetic energy. As a result, the strong exothermicity of the III-N reaction need not be dissipated through the growing III-N film. Nitrogen accommodation is enhanced and sputtering damage minimized, to yield high quality films at a growth rate limited only by the flux at which the metastable molecules are supplied to the film.

Many different varieties of plasma sources, often incorporating supersonic jet techniques, have been employed to "activate" nitrogen for III-N growth. These have included radio frequency (RF) discharges, microwave discharges, electron cyclotron resonance (ECR) discharges, various arc-jet discharges, and hollow anode plasma discharges. Invariably, these sources produce a broad spectrum of both atomic and molecular excited states and often ionic states as well. In marked contrast, a corona discharge supersonic free-jet expansion can yield predominantly the long-lived metastable $N_2 A^3\Sigma_u^+$ state and in appreciable quantities. As such it becomes the primary candidate for testing GaN growth via $A^3\Sigma_u^+$ nitrogen molecules.

The above and further objects and advantages of the invention will be better understood with reference to the following Detailed Description taken in consideration with the accompanying drawings.

DETAILED DESCRIPTION

Figure 1:
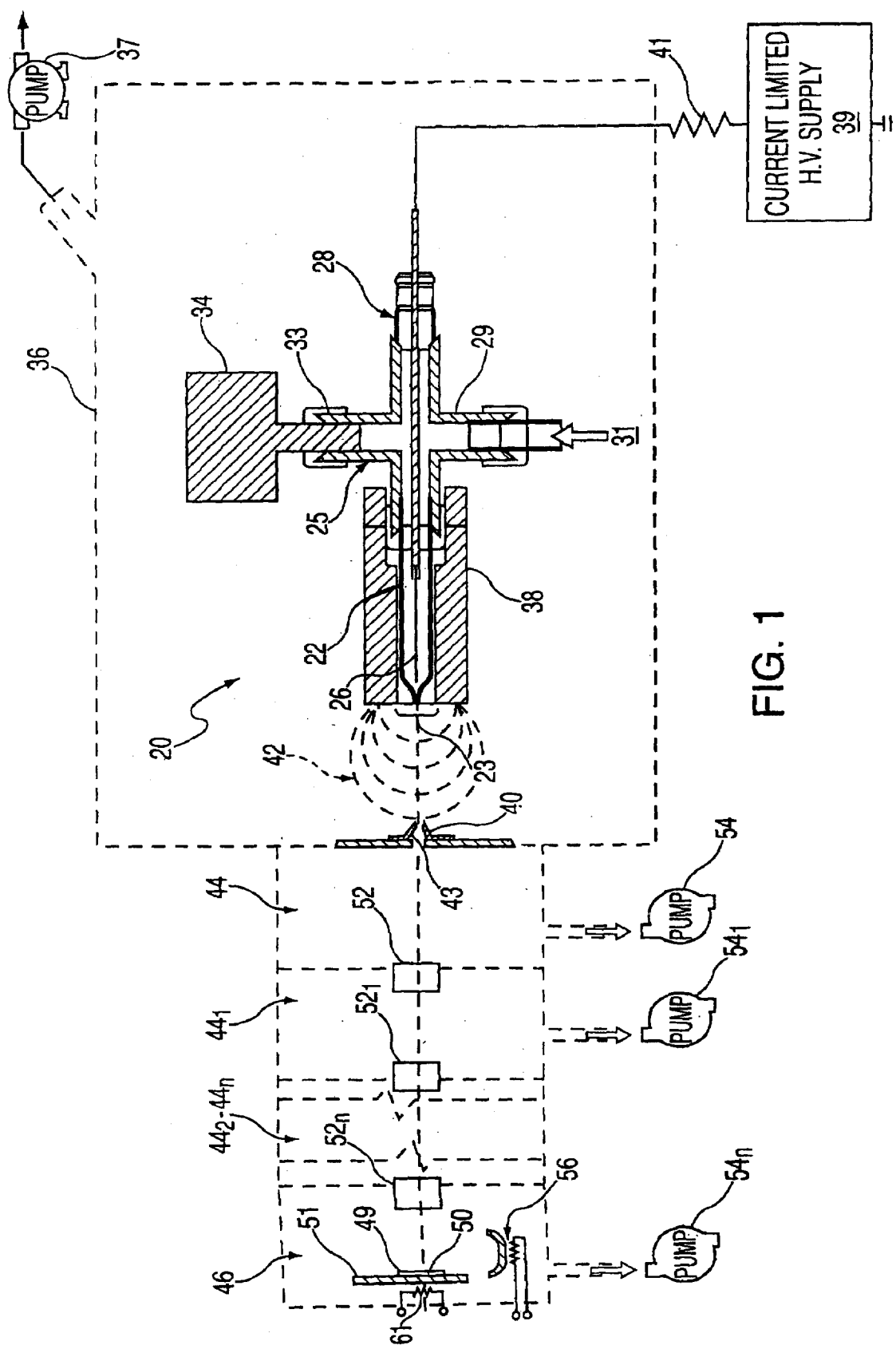
FIG. 1 is a diagrammatic illustration of a supersonic corona discharge source for use in depositing activated nitrogen molecules on a substrate.

In FIG. 1, a corona discharge supersonic free-jet source 20 has a quartz tube 22 (6 mm O.D., 4 mm I.D.), which has been heated and drawn to closure then ground back to form a nozzle orifice 23 with diameter of 200 μm as measured by an optical comparator. The tube 22 is mounted in a ¼" Swagelock cross 25 to allow as one electrode a tungsten or rhenium corona wire 26 (diameter 0.25 mm) to be inserted via a high voltage feedthrough 28 welded into the opposing leg of the cross. Source gas enters through one transverse leg 29 of the cross 25 as indicated at 31. The opposing leg 33 serves as the means of mounting the cross on a "A" stud 34, all within a source vacuum chamber 36. The nozzle was operated at a stagnation pressure of typically 200–440 Torr, producing a background pressure of $1\times10^{-6}$ torr in the source vacuum chamber 36 pumped by an 18,000 l/s diffusion pump 37. A circular auxiliary electrode 38 was positioned just downstream of the nozzle, outside of the free-jet boundary, to provide a point of attachment for the corona discharge. The discharge can be operated with the corona wire 26 either positive or negative with respect to the circular electrode 38. A current limited high voltage supply 39 to the corona wire was ballasted with a 250 kΩ series resistor 41. Under these conditions a voltage of 4–6 kV applied to the corona wire produces a discharge current of 6–18 mA and results in a readily discernible bright plume at the tip of the nozzle as diagrammatically shown at 42. The turn-on procedure is as follows. The source gas is raised to the desired pressure. The current limit of the high voltage power supply to the corona wire 26 is set to the desired discharge current. The voltage is raised until the discharge initiated, whereupon the current jumps immediately to the current limit, placing the power supply in its current-limited mode. Once the discharge is struck, the emission current can be adjusted within bounds determined by the current-voltage characteristics of the discharge.

A custom-made refractory graphite skimmer 40, with a diameter 0.75 mm opening 43 at its apex, extracts the isentropic core of the free-jet plasma expansion to form a molecular beam. Skimmers of the kind used here are described in D.C. Jordan, R. Barling and R. B. Doak, Refractory Graphite Skimmers for Supersonic Free-jet, Supersonic Arc-jet, and Plasma Discharge Applications, 70 Rev. Sci. Instrum. 1640 (1999), incorporated herein by reference, and in U.S. provisional patent application Serial No. 60/092,815 of Jordan, Barling and Doak, filed Jun. 8, 1998, also incorporated herein by reference. The shape and the very sharp edge of the front of the skimmer allow a shock wave to attach to the front of the skimmer. In this aerodynamic flow configuration, the central portion of the beam passes into and through the skimmer without being influenced by the skimmer edge. Further downstream of the skimmer, where the beam density is much less, simple apertures in flat plates can be used as collimators $52-52_n$ for further collimation of the beam. Downstream of the skimmer, several differentially pumped stages $44-44_n$ lead to a deposition chamber 46 where controlled growth can take place under UHV molecular beam epitaxy (MBE) conditions.

The differential pumping is employed to ensure that essentially only the collimated, directed beam provides reactants to the surface 49 of a target substrate 50 supported in a final chamber 46 by a suitable means for locating the substrate as is diagrammatically indicated at 51. Background gases in the various vacuum chambers $44-44_n$ also flow through a series of collimators $52-52_n$ separating one chamber from the next. As mentioned, these may be simply small openings in the wall separating one chamber from another or one or more may be a skimmer similar to the skimmer 40. There occurs what is called "effusion" of the background gas. Entering a chamber background gas is broadly distributed in angle (spread of about 100 deg) in contrast to the directed beam (about 0.5 deg). By using the several vacuum chambers $44-44_n$ in series, with each separated from the next by a small collimator $52-52_n$, this effusive flow can be markedly reduced with no effect whatsoever on the directed beam. The collimators are all carefully aligned in a straight line so that the directed beam, which is smaller in diameter than the collimators, passes through them unhindered. This produces "differential pumping" to reduce the background gas pressure and the background effusion from one differential pumping stage to the next. The decrease in chamber pressures proceeding downstream from the source is the desired result, but is not adjusted, per se, other than by setting the size of the apertures and the size of the vacuum pump $54-54_n$ in each differential pumping section. Depending on the need in a particular application, greater or lesser elimination of effusion of the background gas may be required requiring more or fewer of the stages $44-44_n$. Typically, the pressure might be 0.0001 torr in the source chamber, 0.0000001 torr in the next chamber, and decrease by a factor of ¹⁄₁₀ in each subsequent differential pumping section. All of these background pressures are sufficiently low to result in no significant attenuation of the directed beam due to scattering from the background gas molecules as the beam passes through each differential pumping chamber.

Figure 2:
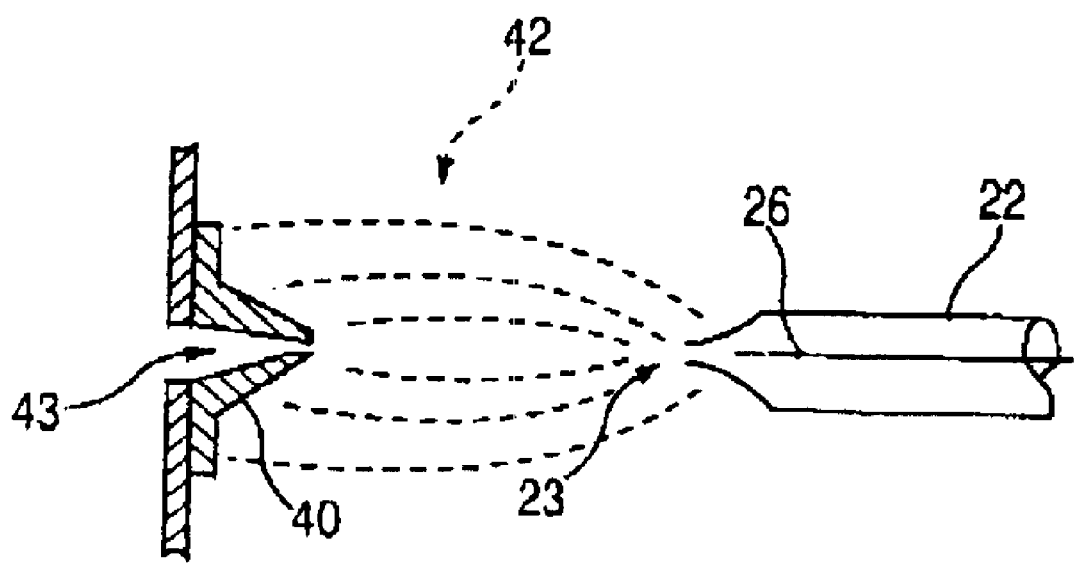
FIG. 2 is a fragmentary diagrammatic illustration of an alternative embodiment of the supersonic corona discharge source of FIG. 1.

Photographs of typical corona discharge plumes are provided in FIG. 2 of the above-identified provisional application Serial No. 60/213,149 that is incorporated by reference. The appearance of the plume depended strongly on the polarity of the corona wire. The "positive" corona discharge (i.e., the corona wire held positive with respect to the circular guard electrode) ran at lower discharge current but somewhat higher voltage than the "negative" corona. The positive corona developed a bright purple-violet plasma plume whereas the negative corona plume was orange and less luminous. The positive corona was interrupted by continual flickering and sparking while the negative discharge was steady and stable.

Apart from its very high initial gas temperature (several thousand degrees), a CD-SFJ is similar to any supersonic free-jet. Its state specificity derives from rapid cooling within the free-jet expansion. The corona discharge is struck within the nozzle tube, upstream of the nozzle throat. As the gas expands through the throat into high vacuum, the rapid decrease in free-jet density terminates the discharge within a few nozzle diameters of the throat. The expansion itself, however, continues much farther downstream. This depopulates excited states, both by collision-induced relaxation within the continuum portion of the expansion and by spontaneous radiative relaxation in the free molecular flow regime further downstream. With proper selection of discharge power, corona polarity, nozzle stagnation pressure, and nozzle diameter, all but long-lived metastable species return to the ground state. The manifold of $N_2$ triplet excited states cascades down to collect in the metastable $A^3\Sigma_u^+$ state, leaving only this plus the $N_2 X^1\Sigma_g^+$ ground state in the terminal beam. "Skimming" and collimating the expansion forms a molecular beam of these two species.

The relevant excited species in a CD-SFJ of molecular nitrogen are the $N_2$ triplet states $A^3\Sigma_u^+$, $B^3\Pi_g$, $C^3\Pi_u$, and $W^3\Delta_u$. Other molecular excited states can also be present, as can Rydberg states. Due to small excitation cross sections and/or short lifetimes, however, these other states play no significant role. Electron impact excitation cross sections for the $N_2$ triplet states are listed in Table I. Radiative lifetimes are presented for representative vibrational levels of these species. The excitation cross sections peak at a fraction of 1 $Å^2$ at electron impact energies of 12–18 V.

TABLE I

Top two rows: Maximum integral cross sections for excitation of relevant $N_2$ species and electron impact voltage at which maximum occurs.
Following rows: Representative radiative lifetimes of species in various vibrational levels.

| Excited Species | $A^3\Sigma_u^+$ | $B^3\Pi_g$ | $C^3\Pi_u$ | $W^3\Delta_u$ |
|---|---|---|---|---|
| Max. Excitation Cross Section | 0.225 $Å^2$ | 0.299 $Å^2$ | 0.443 $Å^2$ | 0.380 $Å^2$ |
| Electron Impact Voltage | 17 V | 12 V | 14 V | 16 V |
| Radiative Lifetime, $v = 0$ | 1.3/2.5 s | 8–13 µs | 36–39 ns | 4/32 s |
| Radiative Lifetime, $v = 1$ | 1.3 s | 8–11 µs | 36–39 ns | 4.5 ms |
| Radiative Lifetime, $v = 2$ | 1.3 s | 7–9 µs | 37–38 ns | 1.2 ms |
| Radiative Lifetime, $v = 3$ | 1.4 s | 7–8 µs | 38 ns | 600 µs |
| Radiative Lifetime, $v = 4$ | 1.4 s | 6–7 µs | 36–39 ns | 370 µs |
| Radiative Lifetime, $v = 8$ | 1.4 s | 5 µs | — | 130 µs |

The terminal beam velocity for the current CD-SFJ pure $N_2$ was measured to be 2100 m/s under typical source settings. At this speed, and given the lifetimes of Table I, the $A^3\Sigma_u^+$ state will survive for kilometers and will clearly be present in the terminal beam. In contrast, $C^3\Pi_u$ will relax spontaneously within a few microns of its point of excitation. The $B^3\Pi_g$ state will survive for only a few centimeters. The $W^3\Delta_u$ state might survive into the terminal beam. Re-excitation processes can alter these simple relaxation trends. The $W^3\Delta_u$ vibrational levels overlap with those of the $A^3\Sigma_u^+$ and $B^3\Pi_g$ and relax via a cascade through these latter states. This repopulates the $B^3\Pi_g$ states and gives rise to a long-lived afterglow on the B→A emission lines. Although this decay cascade is accelerated by collisions of excited $N_2$ with other beam species or with background gases, the low vibrational levels of $W^3\Delta_u$ and (transiently) $B^3\Pi_g$ might still be present far downstream of the discharge.

The incorporated by reference provisional application Serial No. 60/213,149 reports on time-of-flight energy analysis, optical emission spectroscopy, and appearance potential spectroscopy for beams created by a CD-SFJ as described herein. Pitot (stagnation pressure gauge) measurements of beam flux are there reported as are measurements of relative fractions of $N_2A^3\Sigma_u^+$ excited state and $N_2x^1\Sigma_g^+$ ground state in the terminal beam. Beams of 100% nitrogen as well as mixtures of 10% and 20% mole fraction $N_2$ in $A_r$ are discussed there. Pitot measurements of absolute beam intensity are described, as are emission spectra from negative and positive CD-SFJ plumes. Both non-disassociative and disassociative ionization is investigated by appearance potential spectroscopy and reported upon.

For the purposes of nitride layer growth, it is the flux of excited molecular species in the terminal beam which is significant. From the measured beam fractions of the excited states and with absolute pitot measurements of the terminal beam intensity, the appropriate excited state fluxes at any desired working distance from the source are easily computed. Values are compiled in Table II for the 64 cm source-to-target distance of the current experimental configuration. Fluxes of a few tenth of one monolayer per second are readily achieved. As already apparent in FIGS. 5a and 6a of the provisional patent application, Serial No. 60/213,149, the beam fraction and therefore the flux of excited species increases significantly with increased discharge current. Optimum fluxes were obtained with a new graphite skimmer having the sharpest possible leading edge. Yet even upon averaging over 100 hours of operation, the average flux decreased by less than a factor of two from this optimum. This flux suffices for a growth rate of one to several hundred Angstrom per hour. This can be increased in one of several ways as mentioned below. This rate is, nevertheless, sufficient for production of certain semiconductor substrate and nitride layer capable of use in a semiconductor device, including but not limited to ultrathin transistor gate dielectrics of high dielectric constant as discussed further below.

CD-SFJ beams of argon/nitrogen mixtures also readily yielded the $N_2A^3\Sigma_u^+$ state. In fact, with a negative corona discharge and 20% mole fraction mixture of nitrogen in argon, the flux of excited species was essentially the same as with 100% nitrogen gas. Since the nitrogen velocity in this dilute "seeded" beam is lower by roughly $(m_{Ar}/m_{N2})^{1/2}$, it follows that the absolute density of excited states must be even higher in the mixture than in the pure nitrogen beam. The metastable flux decreases at concentrations both higher and lower in nitrogen than the 20% mixture. Measurements were made down to 10% nitrogen/argon mixture, below which there was insufficient intensity to record accurate APS curves.

Using the CD-SFJ source of $N_2A^3\Sigma_u^+$, AlN and GaN films were grown on Si(100) and 6H—SiC(0001), Ga and Al being supplied from effusive sources indicated schematically at 56.

TABLE II

Flux of excited molecular nitrogen from CD-SFJ source as extracted from appearance potential spectroscopy and pitot measurements. Two values listed for 100% $N_2$ at 18 mA, corresponding to measurement with a pristine skimmer (best achievable flux with current apparatus, first row) and an average over 27 actual deposition runs totaling 110 hours (second row).

| Gas | Polarity | Discharge Current (mA) | Excited Beam Fraction (%) | Beam Intensity ($10^{18}$ #/sr/s) | Excited Species Flux ($10^{13}$ #/cm²/s) |
|---|---|---|---|---|---|
| 100% $N_2$ | Neg. | 18 (best) | 1.74 | 6.47 | 2.75 |
| " | " | 18 (avg) | 1.68 | 4.30 | 1.67 |
| " | " | 14 | 0.88 | 6.66 | 1.43 |
| " | " | 11 | 0.80 | 6.04 | 1.18 |
| " | " | 8 | 0.61 | 5.75 | 0.85 |
| " | Pos. | 6 | 1.04 | 1.84 | 0.47 |
| 20% $N_2$/Ar | Neg. | 18 | 4.96 | 1.20 | 1.45 |
| 60% $N_2$/Ar | " | 18 | 2.71 | 1.48 | 0.98 |

GaN was also grown on AlN buffer layers deposited in situ on SiC. The highest incorporation efficiencies and best epitaxial interfaces were obtained with a metal/nitrogen flux ratio of approximately 1.25. Growth rates with the current CD-SFJ source were 70 to 120 Å per hour. Over 30 separate deposition runs of various duration and source settings were carried out to produce films ranging in thickness from 300 to 900 Å. The films were characterized ex situ by Rutherford backscattering spectrometry (RBS), scanning electron microscopy (SEM), electron channeling pattern (ECP), atomic force microcopy (AFM), and transmission electron microscopy (TEM). The measured incorporation efficiency (N atoms attaching per incident $N_2$ molecule) approached 100% and was independent of the substrate temperature from 600 to 900° C. A heat (or cooling) source 61 may be incorporated as needed in the CD-SFJ to arrive at and maintain the desired temperature. Direct molecular chemisorption seems to be the underlying growth mechanism. Both hexagonal and cubic GaN films could be grown with an abrupt, well ordered epitaxial interface on 6H-SiC(0001) and with good crystallinity in the film. Good epitaxial interfaces were obtained even when GaN was grown directly on SiC.

The described corona discharge metastable nitride source can be used to apply a nitride layer to a multilayer substrate. For example, the substrate may comprise a semiconductor stratum, of for example Si or Se, and an epitaxial oxide layer on which the nitride layer may be grown.

The described corona discharge metastable nitrogen source can be used to grow silicon oxynitride gate dielectrics. As in the growth of GaN and AlN epitaxial films, the dissociative reaction of the metastable nitrogen molecules will promote efficient local attachment of the nitrogen within the growing dielectric film, allowing growth of oxynitride films of any desired composition profile. This is important to current semiconductor devices, the further miniaturization of which will be limited in the very near future (ca. 2006) by the properties of the silicon oxide gate dielectrics that are currently the industry standard.

The corona discharge free-jet source described produces an average $N_2A^3\Sigma_u^+$ metastable intensity of $7\times10^{16}$ metastables $sr^{-1}$ $s^{-1}$, two orders of magnitude higher than intensities reported for rare gas metastables. Growth studies verify that $N_2A^3\Sigma_u^+$ is a very efficient nitrogen reactant for MBE growth of III-N semiconductor thin films. For commercial growth, an increase in $N_2A^3\Sigma_u^+$ flux of at least one order of magnitude would be desirable. Similarity laws for glow discharges suggest that this might be realized by simply decreasing the diameter of the CD-SFJ nozzle and operating at higher nozzle stagnation pressure. Specifically, the concentration of metastables produced in a single stage glow discharge excitation is predicted to change by a factor of $\alpha^{-2}$ if the linear dimensions of the discharge are increased by a factor of $\alpha$. To maintain similarity under the new source dimensions, the stagnation pressure p of the discharge must be changed by a factor of $\alpha^{-1}$. Since the throughput of the supersonic nozzle scales as roughly p $\alpha^2$, the metastable concentration in the CD-SFJ is expected to scale as $\alpha^{-1}$. If these similarity laws apply, the metastable throughput will be increased by decreasing the linear dimensions of the source and raising the nozzle pressure proportionally.

An extension, both for purposes of increased intensity and for beam uniformity, would be to employ an array of miniature CD-SFJ nozzles and to skim with a very large diameter skimmer. Glass capillary tubing is easily "pulled" to rupture at a neck diameter of under 1 $\mu$m and miniature nozzle tubes fabricated in this fashion could be bundled to form a nozzle array. Even smaller sized nozzle tubes have been formed in this laboratory by pulling hollow core optical fibers (375 $\mu$m O.D.×15 $\mu$m I.D.) and these have been demonstrated to yield high speed ratio supersonic free-jets. In corona discharge applications, joule heating at a given discharge current will ultimately set the minimum diameter of the corona wire and therefore the inner diameter of the nozzle tube. Additional CD-SFJ intensity might also be obtained by terminating the corona discharge not on an external guard anode, as in the current experiments, but on the skimmer itself. This is diagrammatically illustrated in FIG. 2. Neuschäfer et al., at 117 Chem. Phys. 133 (1987), incorporated herein by reference, report being able to achieve somewhat higher intensities in this fashion, albeit at a cost in simplicity, dependability, and skimmer lifetime.

Although preferred embodiments of the invention have been described in detail, it will be readily appreciated by those skilled in the art that further modifications, alterations and additions to the embodiments disclosed may be made without departure from the spirited scope of the invention.

What is claimed is:

1. An apparatus for producing nitride films comprising:
   (a) a pair of corona-discharge producing electrodes,
   (b) a nitrogen delivery path leading to a nozzle at which the electrodes produce a corona discharge,
   (c) means to locate a substrate along the nitrogen delivery path downstream of the location at which the electrodes produce the corona discharge for deposition thereon of nitrogen activated by the corona discharge at a location sufficiently distant from the corona-discharge producing electrodes such that essentially the only activated nitrogen impingent on the substrate is $N_2A^3\Sigma_u^+$, and
   (d) the distance within the apparatus from the corona-discharge producing electrodes to the means to locate a substrate providing a transit time of the nitrogen traveling therebetween along the nitrogen delivery path exceeding the lifetime of activated nitrogen in states other than $N_2A^3\Sigma_u^+$, whereby those states are effectively filtered out of nitro en reaching the location of the means to locate a substrate.

2. The apparatus according to claim 1, further comprising a nozzle with a nitrogen emersion orifice in the nitrogen delivery path, a first one of the corona-discharge electrodes being a cathode proximate the nitrogen emersion orifice of the nozzle, a second of the corona-discharge electrodes being spaced from the nitrogen emersion orifice of the nozzle and the first one of the corona-discharge electrodes, a skimmer located downstream of the nozzle in the direction of nitrogen flow, the skimmer defining an opening to collimate a beam of activated nitrogen molecules passing therethrough, at least one chamber downstream of the skimmer, means for evacuating the chamber to draw off gases other than the activated nitrogen molecules prior to the activated nitrogen molecules reaching the substrate.

3. The apparatus according to claim 2, wherein the at least one chamber comprises one of a plurality of at least two succeeding chambers with means for evacuating each of the succeeding chambers to draw off gases other than the activated nitrogen molecules passing therethrough towards the substrate, each succeeding chamber in the direction of nitrogen flow being evacuated to a lower interior pressure, the last of the downstream chambers containing the means to locate a substrate and, in operation, containing at the location of the means to locate a substrate predominantly ground state $N_2$ molecules and $A^3\Sigma_u^+$ state metastable $N_2$ molecules, whereby the metastable $N_2$ molecules impacting a substrate deliver a single N atom, the further N atom of the $N_2$ pair carrying from the site of impact energy of reaction.

4. The apparatus according to claim 3, wherein the nozzle comprises a restricted end of a tube, the tube being in the nitrogen delivery path, the cathode being located within the tube, and the second of the corona discharge electrodes being electro-positive relative to the cathode and located outside the tube, the nitrogen emergent from the tube into a corona discharge between the electrodes forming with the corona discharge a corona discharge supersonic free-jet.

5. The apparatus according to claim 3, wherein the second of the corona discharge electrodes is generally annular and surrounds the restricted end of the tube.

6. The apparatus according to claim 4, wherein the second of the corona discharge electrodes is downstream of the restricted end of the tube in the direction of nitrogen flow.

7. The apparatus according to claim 6, wherein the skimmer serves as the second of the corona discharge electrodes.

8. The apparatus according to claim 3, wherein, in operation, the pressure in each succeeding chamber is 1/10 or less than the preceding chamber.

9. The apparatus according to claim 8, wherein, in operation, the first chamber, into which the nozzle opens has a pressure less than $10^{-6}$ Torr.

10. The apparatus according to claim 1, further comprising at least one further corona-producing electrode and at least one further nitrogen delivery path to at least one further nozzle.

11. The apparatus according to claim 10, wherein the pair of corona discharge electrodes, the at least one further corona-producing electrode, and the nitrogen delivery paths are part of an array of multiple, activated nitrogen molecule plasma production means opening into a vacuumized chamber.

12. The apparatus according to claim 1, further comprising a source of nitrogen and argon in communication with the nitrogen delivery path, whereby a mixture of nitrogen and argon is delivered along the path to the substrate location.

13. Apparatus for producing a film on a semiconductor substrate comprising:
 (a) means for establishing a vacuumized environment,
 (b) means for establishing a corona discharge in the vacuumized environment,
 (c) means for creating a flow of nitrogen gas into the corona discharge and a supersonic jet of diatomic, activated metastable nitrogen molecules from the corona discharge,
 (d) means for collimating the jet of nitrogen molecules, and
 (e) means for locating a target semiconductor substrate in the path of the collimated jet of nitrogen particles at a distance from the means for establishing a corona discharge such that substantially only diatomic nitrogen molecules of the form $N_2 A^3\Sigma_u^+$ and $N_2 X^1\Sigma_g^+$ are present at that distance, and
 (f) the distance within the apparatus form the corona-discharge producing electrodes to the means for locating a target semiconductor substrate providing a transit time of the nitrogen traveling therebetween in the collimated jet that exceeds the lifetime of activated nitrogen present in the jet in states other than $N_2 A^3\Sigma_u^+$, whereby activated nitrogen in those states are effectively filtered out of the nitrogen present at the means for locating the target semiconductor substrate by their conversion to the $A^3\Sigma_u^+$ state.

14. The apparatus according to claim 13, further comprising means for withdrawing background gases from around the collimated jet of nitrogen molecules.

15. The apparatus according to claim 13, further comprising means for supplying a group III metal to react with the nitrogen molecules at a surface of the substrate to grow a group m metal nitride film on the surface.

16. The apparatus according to claim 13, further comprising:
 (g) means for controlling the temperature of the substrate.

17. The apparatus according to claim 16, wherein the means for controlling the temperature comprises means for bringing the substrate to a temperature below 900° C.

18. The apparatus according to claim 13, further comprising a source of a reagent in addition to the nitrogen for delivering the reagent to the substrate with the metastable nitrogen molecules to form on the substrate a layer that is a nitride of the reagent.

19. An apparatus for producing a dielectric insulator film comprising:
 (a) at least one corona-discharge producing electrode pair,
 (b) at least one source of a pressurized reagent gas,
 (c) at least one path of reagent gas flow to at least one nozzle proximate the tip of one electrode of the at least one pair and in the region of corona discharge,
 (d) a reduced pressure location at an outlet of the nozzle into which the reagent gas emerges as a supersonic jet of activated reagent molecules,
 (e) a skimmer downstream of the nozzle in the direction of flow of the supersonic jet,
 (f) a substrate location downstream of the skimmer, in operation locating a substrate for formation thereon a dielectric film composed at least in part of the reagent, and
 (g) a supersonic jet expansion region between the skimmer and the substrate location of a length to effect filtering out of relatively short-lived excited states of the reagent gas moving in the supersonic jet toward the substrate location.

20. The apparatus according to claim 19, wherein the substrate location is at a distance downstream of the nozzle such that the activated reagent molecules are substantially only ground state molecules and activated molecules of the $A^3\Sigma_u^+$ state.

21. The apparatus according to claim 20, wherein the at least one source of a pressurized reagent gas is a source of diatomic molecules of reagent gas, the activated molecules arriving at the substrate location are diatomic molecules of the $A^3\Sigma_u^+$ state.

22. The apparatus according to claim 19, wherein the at least one corona-discharge producing electrode pair comprises:
 (i) a narrow-tipped, corona-producing cathode adapted to be electro-negatively energized, and
 (ii) a broader surfaced anode adapted to be electro-positively energized relative to the cathode.

23. The apparatus according to claim 19, wherein the reagent gas comprises nitrogen and the dielectric film formed is an oxynitride.

24. The apparatus according to claim 23, wherein the substrate has a growing oxide layer exposed to the nitrogen for formation of the oxynitride film.

* * * * *